United States Patent
Song

(10) Patent No.: US 9,576,629 B2
(45) Date of Patent: Feb. 21, 2017

(54) MEMORY DEVICE AND MEMORY SYSTEM INCLUDING THE SAME, AND OPERATION METHOD OF MEMORY DEVICE

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 268 days.

(21) Appl. No.: 14/030,697

(22) Filed: Sep. 18, 2013

(65) Prior Publication Data

US 2014/0317338 A1 Oct. 23, 2014

(30) Foreign Application Priority Data

Apr. 17, 2013 (KR) .................... 10-2013-0042204

(51) Int. Cl.
| | | |
|---|---|---|
| *G06F 12/00* | (2006.01) | |
| *G11C 7/24* | (2006.01) | |
| *G11C 7/20* | (2006.01) | |
| *G11C 29/00* | (2006.01) | |
| *G11C 29/04* | (2006.01) | |
| *G11C 29/44* | (2006.01) | |

(52) U.S. Cl.
CPC . *G11C 7/24* (2013.01); *G11C 7/20* (2013.01); *G11C 29/785* (2013.01); *G11C 2029/0401* (2013.01); *G11C 2029/4402* (2013.01)

(58) Field of Classification Search
None
See application file for complete search history.

(56) References Cited

U.S. PATENT DOCUMENTS

| | | | |
|---|---|---|---|
| 6,667,902 B2 | 12/2003 | Peng | |
| 6,777,757 B2 | 8/2004 | Peng et al. | |
| 6,904,751 B2 | 6/2005 | Makki et al. | |
| 7,173,851 B1 | 2/2007 | Callahan et al. | |
| 7,269,047 B1 | 9/2007 | Fong et al. | |
| 7,746,712 B2 | 6/2010 | Kang et al. | |
| 2008/0189473 A1* | 8/2008 | Murray | 711/103 |
| 2010/0115185 A1* | 5/2010 | Ono | G06F 12/0246 711/103 |
| 2011/0167209 A1* | 7/2011 | Nakanishi et al. | 711/103 |
| 2011/0238898 A1* | 9/2011 | Honda | G06F 11/1068 711/103 |

FOREIGN PATENT DOCUMENTS

KR 1020060058570 5/2006

* cited by examiner

*Primary Examiner* — Daniel Tsui
(74) *Attorney, Agent, or Firm* — IP & T Group LLP

(57) ABSTRACT

A memory device includes a memory cell array having a plurality of memory cells, a storage unit suitable for storing a fail address corresponding to a fail memory cell in the memory cell array, an available storage capacity determination unit suitable for generating available capacity information indicating an available storage capacity in the storage unit, and an output circuit suitable for outputting the available capacity information.

13 Claims, 6 Drawing Sheets

MEMORY DEVICE AND MEMORY SYSTEM INCLUDING THE SAME, AND OPERATION METHOD OF MEMORY DEVICE

CROSS-REFERENCE TO RELATED APPLICATIONS

The present application claims priority of Korean Patent Application No. 10-2013-0042204, filed on Apr. 17, 2013, which is incorporated herein by reference in its entirety.

BACKGROUND

1. Field

Exemplary embodiments of the present invention relate to integrated circuit design, and more particularly, to a post package repair for an Integrated circuit.

2. Description of the Related Art

FIG. 1 is a block diagram illustrating a conventional memory device performing a repair operation.

Referring to FIG. 1, the memory device includes a memory cell array 110, a row circuit 120, a column circuit 130, a row fuse circuit 140, and a row comparison unit 150.

The memory cell array 110 includes a plurality of memory cells, the row circuit 120 activates a row (or a word line) selected by a row address R_ADD, and the column circuit 130 accesses, for example, reads or writes, data of a column (or a bit line) selected by a column address C_ADD. The row fuse circuit 140 stores a row address corresponding to a defective memory cell within the memory cell array 110 as a repair row address REPAIR_R_ADD. A row comparison unit 150 compares the repair row address REPAIR_R_ADD stored in the row fuse circuit 140 to a row address R_ADD inputted from the outside of the memory device. When the repair row address REPAIR_R_ADD is identical with the row address R_ADD, the row comparison unit 150 controls the row circuit 120 to access a redundancy row (or a redundancy word line) instead of a row designated with the row address R_ADD. That is, the row (or the word line) corresponding to the repair row address REPAIR_R_ADD stored in the row fuse circuit 140 is substituted with a redundancy row (or a redundancy word line).

For reference, in the FIG. 1, "ACT" denotes an active command, "PRE" denotes a precharge command, "RD" denotes a read command, "WT" denotes a write command, and "DQs" denotes data or data pads.

Conventionally, laser fuses have been mainly used in the fuse circuit 140. The laser fuse stores a logic high data or a logic low data depending on whether the fuse is cut or not. The laser fuse may be programmed in a wafer state, but the fuse may not be programmed after a wafer is mounted in a package. Furthermore, the laser fuses may not be designed in a small area due to the limit in a line pitch.

In order to overcome such concerns, as disclosed in U.S. Pat. No. 6,904,751, U.S. Pat. No. 6,777,757, U.S. Pat. No. 6,667,902, U.S. Pat. No. 7,173,851, and U.S. Pat. No. 7,269,047, one of storage units, such as an e-fuse array circuit, a NAND flash memory, a NOR flash memory, a magnetoresistive random access memory (MRAM), a spin transfer torque magnetic random access memory (STT-MRAM), a resistive random access memory (ReRAM), and a phase change random access memory (PCRAM), is included into the memory device. Repair information, including, for example, fail addresses, is stored in the storage unit.

FIG. 2 is a block diagram illustrating a conventional memory device including storage unit for storing repair information.

Referring to FIG. 2, it may be seen that the fuse circuit 140 is removed from the memory device shown in FIG. 1 and a storage unit 210 and a register unit 220 are added.

The row fuse circuit 140 is substituted with the storage unit 210. Here, a row address corresponding to a defective memory cell in the memory cell array 110 is stored as a repair row address. The storage unit 210 may include an e-fuse array circuit, a NAND flash memory, a NOR flash memory, an MRAM, an STT-MRAM, a ReRAM, or a PCRAM.

The register unit 220 receives and stores repair information, for example, a fail address, programmed in the storage unit 210. The repair information stored in the register unit 220 is used for a repair operation. The register unit 220 may include latch circuits and may store the repair information only while power is supplied. An operation for transmitting the repair information from the storage unit 210 to the register unit 220 is referred to as a boot-up operation.

Since the storage unit 210 is configured in an array form, it takes some time to call internally stored data. Because calling for data may not be performed takes some time, it may not be possible to perform a repair operation immediately using the data stored in the storage unit 210. Accordingly, after the boot-up operation is performed to transmit the repair information stored in the storage unit 210 to the register unit 220 and to store the repair information, the repair operation is performed using the data stored in the register unit 220.

When the fuse circuit 140 including the laser fuses is substituted with the storage unit 210 and the register unit 220, it may be possible to repair an additional defect found in a package state. On the other hand, in recent years, technologies for accessing the storage unit 210 even after manufacturing of a memory device, for example, after selling of a product, and for repairing a defect occurring after the manufacturing of the memory device have been studied.

SUMMARY

Various embodiments are directed to a technology for generating and utilizing available capacity information denoting an amount of an available storage capacity within a storage unit included in a memory device and an integrated circuit.

In an embodiment, a memory device may include a memory cell array having a plurality of memory cells, a storage unit suitable for storing a fail address corresponding to a fail memory cell in the memory cell array, an available storage capacity determination unit suitable for generating available capacity information indicating an available storage capacity in the storage unit, and an output circuit suitable for outputting the available capacity information.

In an embodiment, a memory device may include a memory cell array having a plurality of memory cells, a storage unit suitable for storing a fail address corresponding to a fail memory cell within the memory cell array, an available storage capacity determination unit suitable for generating occupied amount information indicating a storage capacity occupied in the storage unit, and a control unit suitable for controlling the storage unit to be programmed with an additional fail address inputted from the outside at an available position of the storage unit determined using the occupied amount information.

In an embodiment, a memory system may include a memory device with a memory cell array storing data and a storage unit storing a fail address corresponding to a fail memory cell within the memory cell array, and suitable for outputting available capacity information indicating a storage capacity available in the storage unit, and a memory controller suitable for transmitting an additional fail address to the memory device based on the available capacity information, and controlling the memory device such that the additional fail address is programmed in the storage unit.

In an embodiment, an integrated circuit may include an e-fuse array having a plurality of fuse sets, wherein each of the fuse sets is suitable for storing respective program validity information denoting program validity of the corresponding fuse set and a boot-up data required for an operation of the integrated circuit, and an available capacity determination unit suitable for generating available capacity information denoting an amount of an available storage capacity within the e-fuse array by counting the activated program validity information, when the boot-up operation is performed.

In an embodiment, an operating method of memory device with a programmable storage unit storing a fail address, the operating method may include generating available capacity information for the programmable storage unit, transmitting the available capacity information to a memory controller, entering a post package repair mode under the control of the memory controller, receiving an additional fail address from the memory controller, temporarily storing the additional fail address, programming the temporarily stored additional fail address in the programmable storage unit, and exiting from the post package repair mode under the control of the memory controller.

DETAILED DESCRIPTION

Figure 1:
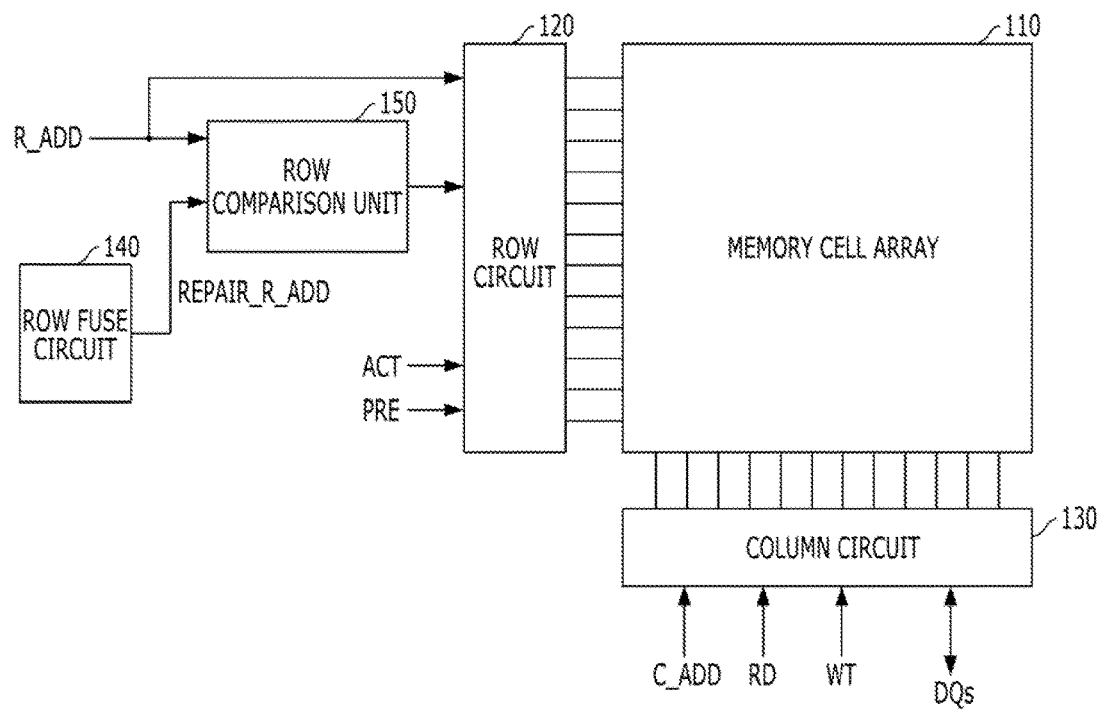
FIG. 1 is a block diagram illustrating a conventional memory device performing repair operation.

Hereinafter, embodiments of the present invention will be described with reference to the accompanying drawings to make detailed description such that those skilled in the art may easily embody the technical spirit and essence of the present invention. In the description of the present invention, known configurations irrelevant to the gist of the present invention may be omitted. Throughout the disclosure, reference numerals correspond directly to the like numbered parts in the various figures and embodiments of the present invention. In addition, a singular form may include a plural form as long as it is not specifically mentioned in a sentence.

Figure 3:
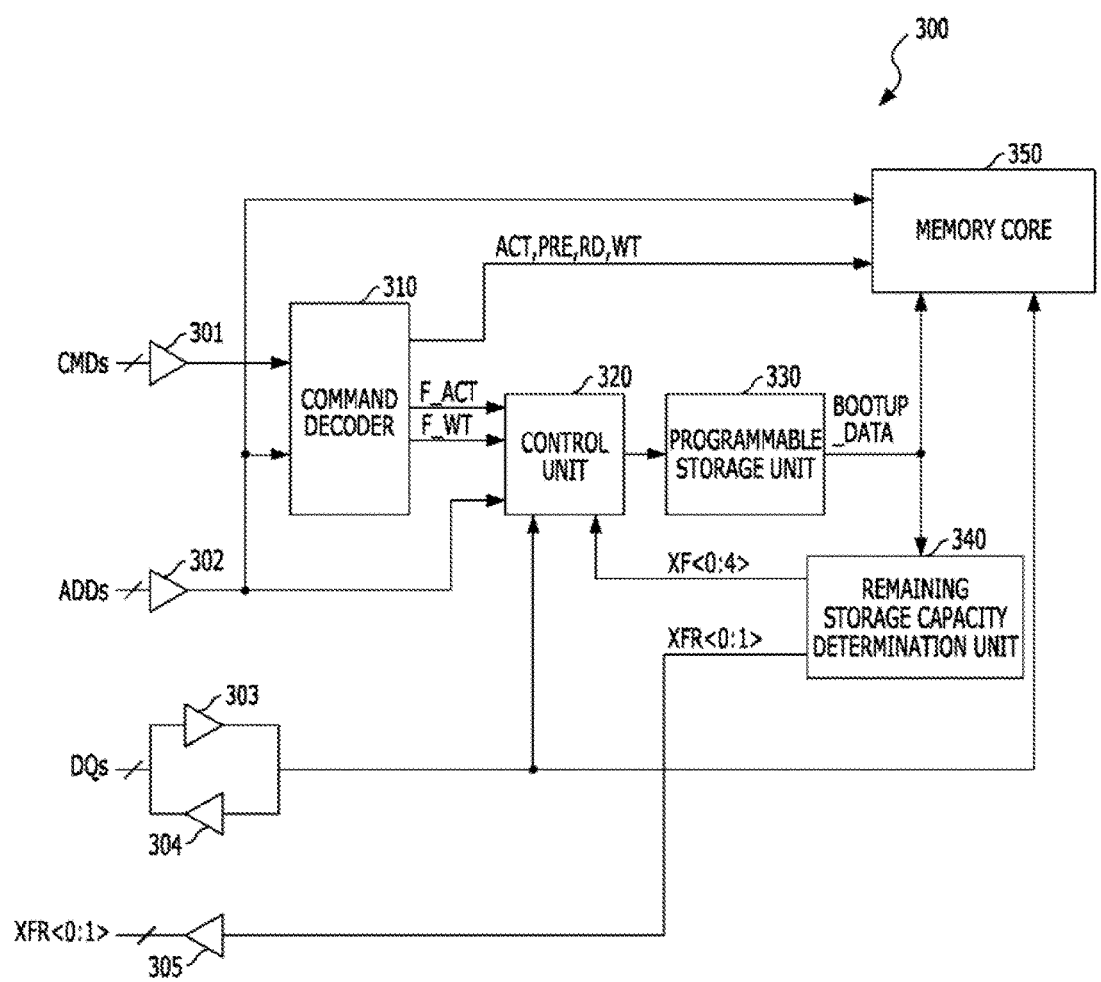
FIG. 3 is a block diagram illustrating a memory device according to an embodiment of the present invention.

FIG. 3 is a block diagram illustrating a memory device 300 according to an embodiment of the present invention.

Referring to FIG. 3, the memory device 300 may include a command input unit 301, an address input unit 302, a data input unit 303, a data output unit 304, an output circuit 305, a command decoder 310, a control unit 320, a storage unit 330, an available storage capacity determination unit 340, and a memory core 350.

The command input unit 301 receives command signals CMDs inputted from the outside of the memory device 300, for example, from a memory controller. The command signals CMDs may include a chip select signal CS, an active signal ACT, a row address strobe signal RAS, a column address strobe signal CAS, and a write enable signal WE.

The address input unit 302 receives address signals ADDs configured by multi-bits inputted from the outside of the memory device 300. The address signals ADDs may include not only normal address meaning row and column addresses but also bank group addresses and bank addresses. The row and column addresses may be inputted through the same pad, addresses inputted in synchronization with the row address strobe signal RAS are recognized as the row addresses by the memory device, and addresses inputted in synchronization with the column address strobe signal CAS are recognized as the column addresses by the memory device 300.

The data input unit 303 receives multi-bit data DQs inputted from the outside of the memory device 300, and the data output unit 304 outputs the data to the outside of the memory device 300. For example, data to be written on the memory device 300 is inputted through the data input unit 303, and data to be read in the memory device 300 is output through the data output unit 304.

The command decoder 310 generates command signals by decoding the command signals inputted through the command input unit 301. The command signals may include an active command ACT, a precharge command PRE, a read command RD, and a write command WT. These commands (ACT, PRE, RD, and WT) are transmitted to the memory core 350. On the other hand, the command decoder 310 may perform various setting operations and a mode entrance operation by combining some of the command signals CMDs inputted through the command input unit 301 and the address signals ADDs inputted through the address input unit 302, and thus may enter a repairable mode (also referred to as a post package repair mode, meaning that repairing may be performed after a memory is manufactured) through these operations. When the active command is inputted combining the command signals CMDs after the entrance into the repairable mode, the command decoder 310 activates a repair active command F_ACT, instead of the active command ACT. When the write command is inputted combining the command signals CMDs, the command decoder 310 activates a repair write command F_WT, instead of the write command WT. That is, in a normal mode (which is a mode rather than the post package repair mode), the command decoder 310 generates the commands ACT, PRE, RD, and WT used to control the memory core 350 by decoding the command signals CMDs. When entering the repairable mode, the command decoder 310 generates the command signals F_ACT and F_WT to be transmitted to the control unit 320 by decoding the command signals CMDs.

Figure 2:
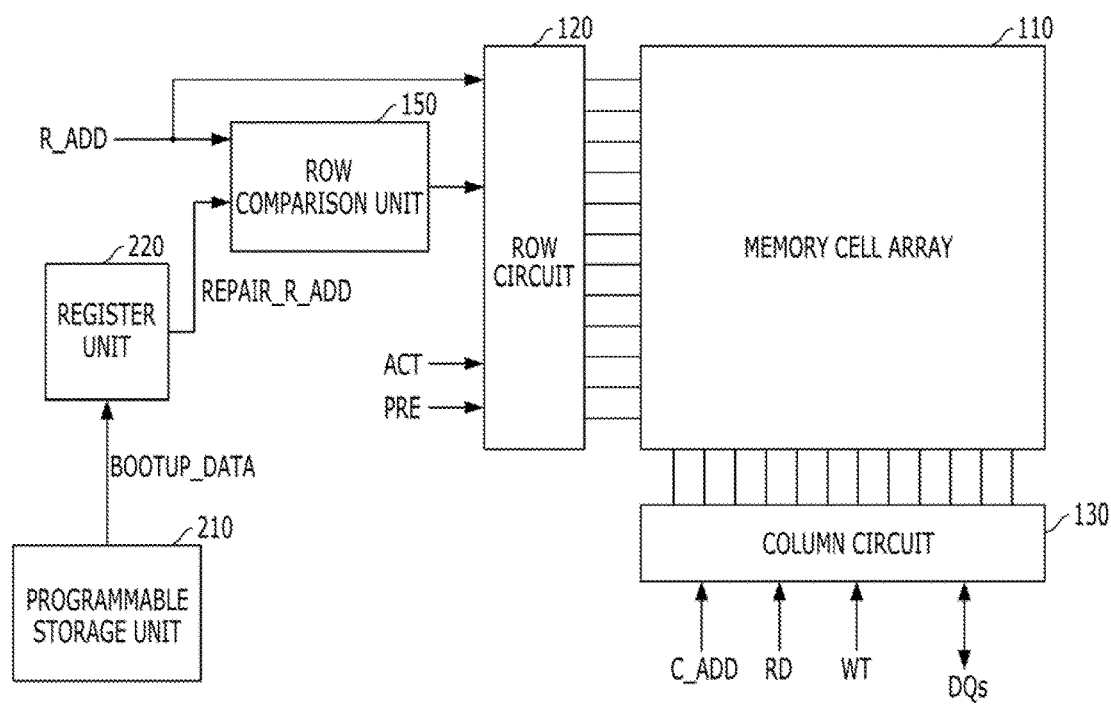
FIG. 2 is a block diagram illustrating a conventional memory device including storage unit for storing repair information.

The memory core 350 may include the memory cell array 110, the row circuit 120, the column circuit 130, the row comparison unit 150, and the register unit 220 illustrated in FIG. 2. The memory core 350 performs an operation of reading/writing data from/into the memory cell array 110 according to an instruction of the command decoder 310. A defect inside the memory cell array 110 is substituted (or repaired) using repair information (or boot-up data) BOOTUP_DATA transmitted from the storage unit 330 to the register unit 220.

The storage unit 330 stores a fail address indicating the position of a defect in the memory cell array 110. The storage unit 330 includes a plurality of storage sets, for example, a plurality of fuse sets. When the boot-up operation of transmitting data of the storage unit 330 to the register unit 220 is performed, a read operation of reading data stored in the storage unit 330 is repeatedly performed. The data in one storage set may be read whenever one read operation is performed. Each storage set stores use information (or validity information) EN and a fail address A<0:N> of the corresponding storage set. The use information indicates whether the corresponding storage set is occupied (or programmed) or not. An information form stored in the storage unit 330 may be illustrated as in Table 1.

TABLE 1

INFORMATION TO BE STORED

| STORAGE SET | EN | A<0> | A<1> | A<2> | A<3> | A<4> | A<5> | A<6> | A<7> | A<8> | ... | A<N-1> | A<N> |
|---|---|---|---|---|---|---|---|---|---|---|---|---|---|
| 1 | 1 | 1 | 1 | 0 | 1 | 0 | 0 | 0 | 1 | 1 | ... | 0 | 1 |
| 2 | 1 | 0 | 1 | 0 | 1 | 1 | 1 | 0 | 1 | 0 | ... | 1 | 0 |
| 3 | 1 | 0 | 1 | 1 | 0 | 0 | 1 | 0 | 1 | 1 | ... | 0 | 0 |
| 4 | 1 | 1 | 0 | 1 | 0 | 1 | 0 | 0 | 0 | 0 | ... | 1 | 1 |
| 5 | 1 | 1 | 0 | 0 | 0 | 0 | 1 | 1 | 0 | 1 | ... | 0 | 1 |
| ... | ... | ... | ... | ... | ... | ... | ... | ... | ... | ... | ... | ... | ... |
| 27 | 1 | 0 | 0 | 1 | 1 | 0 | 0 | 1 | 1 | 1 | ... | 0 | 1 |
| 28 | 1 | 1 | 0 | 1 | 0 | 1 | 0 | 1 | 1 | 0 | ... | 1 | 1 |
| 29 | 1 | 0 | 1 | 0 | 1 | 0 | 1 | 0 | 0 | 1 | ... | 0 | 0 |
| 30 | 0 | 0 | 0 | 0 | 0 | 0 | 0 | 0 | 0 | 0 | ... | 0 | 0 |
| 31 | 0 | 0 | 0 | 0 | 0 | 0 | 0 | 0 | 0 | 0 | ... | 0 | 0 |

Referring to Table 1, there are a total of 31 storage sets in the storage unit 330. Accordingly, in the boot-up operation, the read operation has to be performed 31 times to transmit all of the information stored in the storage unit 330 to the register unit 220. The validity information EN indicates whether a fail address A<0:N> stored in the corresponding storage set is valid or not. That is, when the validity information EN is '1,' a fail address A<0:N> stored in the corresponding storage set is valid. When the validity information EN is '0,' a fail address stored in the corresponding storage set is invalid. In Table 1, the 1st to 29th storage sets of the total of 31 storage sets indicate occupied storage sets. That is, the fail addresses stored in the 1st to 29th storage sets indicate the addresses of defective memory cells in the memory cell array. In Table 1, the 30th and 31st storage sets indicate available storage sets. That is, the 30th and the 31st storage sets may be additionally programmed with additional fail addresses.

The available storage capacity determination unit 340 generates occupied amount information XF<0:4> indicating a storage capacity occupied (or programmed) in the storage unit 330 and available capacity information XFR<0:1> indicating a storage capacity available (or non-programmed) in the storage unit 330. The available storage capacity determination unit 340 generates the occupied amount information XF<0:4> and the available capacity information XFR<0:1> in the boot-up operation of transmitting boot-up data BOOTUP_DATA from the storage unit 330 to the register unit 220 of the memory core 350. When the information in Table 1 is stored in the storage unit 330, the read operation is sequentially performed from the 1st storage set to the 31st storage set in the boot-up operation. The available storage capacity determination unit 340 may generate the occupied amount information XF<0:4> indicating the number of storage sets (how many storage sets) occupied in the storage unit 330 by counting the number of the validity information EN activated, for example, having a value of '1', among the boot-up data BOOTUP_DATA read from the storage unit 340 in the boot-up operation and may generate the available capacity information XFR<0:1> indicating the number of storage sets available (or non-programmed) in the storage unit 330.

The control unit 320 controls the storage unit 330 so that a fail address (which is an address indicating a defective position in the memory cell array 110) inputted from the outside of the memory device 300 is recorded on the storage unit 330. When a repair active command F_ACT noticing that a fail address is inputted from the outside of the memory device is activated, the control unit 320 latches the address inputted through the address input unit 302. The address latched by the control unit 320 is a fail address to be recorded on the storage unit 330. When a repair write command F_WT to program the fail address inputted from the outside of the memory device is activated, the control unit 320 controls the storage unit 330 so that the address latched at the time of the activation of the repair active command F_ACT is programmed in the storage unit 330. The control unit 320 confirms whether 0th data (DQ0) among multi-bit data DQs (for example, DQs=DQ0 to DQ15) maintains a 'low' level, when a write latency WL (WL (Write Latency)=CWL (Cas Write Latency)+AL (Additive Latency)+PL (Parity Latency)) has passed from the time of the activation of the repair write command F_WT. When the 0th data DQ0 maintains the 'low' level, the control unit 320 controls the storage unit 330 so that an operation of programming the latched address in the storage unit 330 is performed. However, when the 0th data DQ0 is in a 'high' level, the control unit 320 controls the storage unit 330 so that the latched address is not programmed. The control unit 320 also determines a place in which the address is programmed in the storage unit 330. Here, the occupied amount information XF<0:4> is used. For example, when the occupied amount information XF<0:4> represents 28, it is meant that storage sets are occupied up to the 28th storage set among 31 storage sets in the storage unit 330. Therefore, the control unit 320 controls the storage unit 330 so that the address is programmed in the 29th storage set.

The output circuit 305 outputs the available capacity information XFR<0:1> generated in the available storage capacity determination unit 340 to the outside of the memory device 300. In the embodiment of the present invention, the example has been described in which the available capacity information XFR<0:1> is outputted to the outside of the memory device 300 via a separate pad configured to output only the available capacity information XFR<0:1>. However, the available capacity information XFR<0:1> may be outputted to the outside of the memory device via the same pad as a pad configured to output data from the memory device 300. That is, the available capacity information XFR<0:1> may be output via the data output circuit 304.

Figure 4:
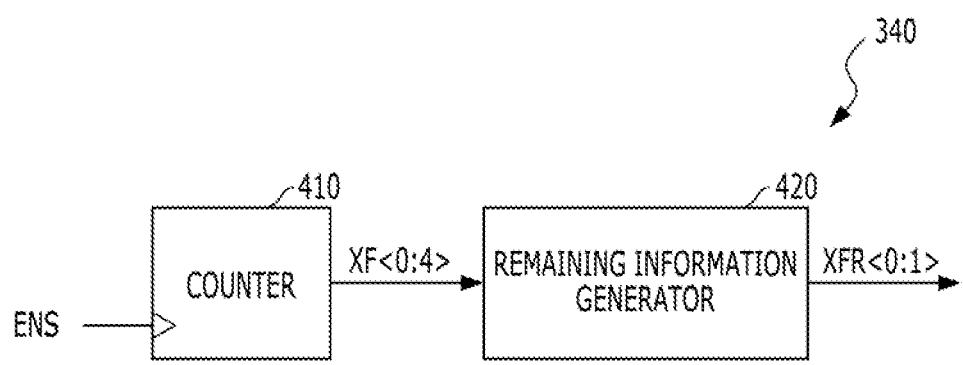
FIG. 4 is a detailed diagram illustrating an available storage capacity determination unit shown in FIG. 3.

FIG. 4 is a detailed diagram illustrating the available storage capacity determination unit 340 shown in FIG. 3.

Referring to FIG. 4, the available storage capacity determination unit 340 may include a counter 410 and an available capacity information generator 420.

The counter 410 receives the validity information EN among the boot-up data BOOTUP_DATA outputted from the storage unit 330 and generates the occupied amount information XF<0:4> by counting how many validity information EN is activated. In the end, the occupied amount information XF<0:4> becomes a binary code that indicates the number of storage sets in which the use information En has the value of '1' among the plurality of storage sets provided in the storage unit 330.

The available capacity information generator 420 generates available capacity information XFR<0:1> indicating the number of storage sets available in the storage unit 330 using the occupied amount information XF<0:4> generated by the counter 410. When the number of storage sets already occupied among the total number of storage sets in the storage unit 330 is excluded, the available capacity information XFR<0:1> is obtained. Therefore, the available capacity information generator 420 may generate the available capacity information XFR<0:1> using the occupied amount information XF<0:4>.

Figure 5:
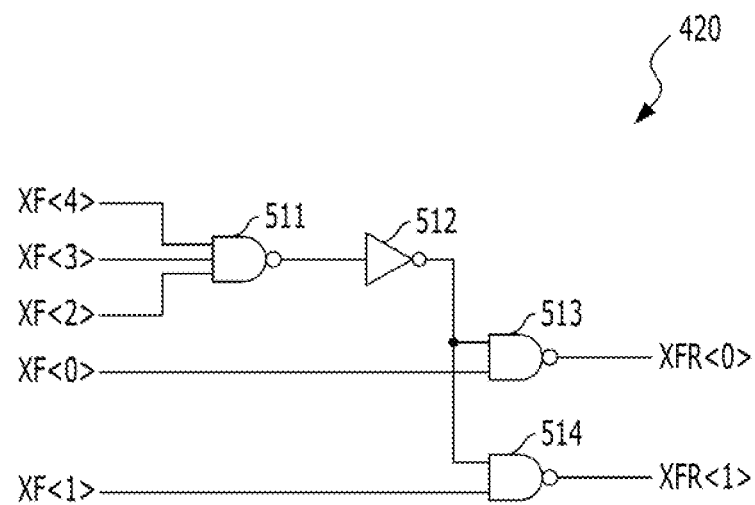
FIG. 5 is a detailed diagram illustrating an available capacity information generator shown in FIG. 4.

FIG. 5 is a detailed diagram illustrating the available capacity information generator 420 shown in FIG. 4.

Referring to FIG. 5, the available capacity information generator 420 may include NAND gates 511, 513, and 514 and an inverter 512.

When the occupied amount information XF<0:4> is 31 (1, 1, 1, 1, 1), that is, all of the 31 storage sets are occupied, the available capacity information generator 420 generates (0, 0) as the available capacity information XFR<0:1>. When the occupied amount information XF<0:4> is 30 (1, 1, 1, 1, 0), the available capacity information generator 420 generates (0, 1) as the available capacity information XFR<0:1>. When the occupied amount information XF<0:4> is 29 (1, 1, 1, 0, 1), the available capacity information generator 420 generates (1, 0) as the available capacity information XFR<0:1>. When the occupied amount information XF<0: 4> is equal to or less than 28 (1, 1, 1, 0, 0), the available capacity information generator 420 generates (1, 1) as the available capacity information XFR<0:1>. That is, available capacity information XFR<0:1> indicates whether the number of storage sets additionally programmable in the storage unit 300 is 0, 1, 2, or 3 or more.

Figure 6:
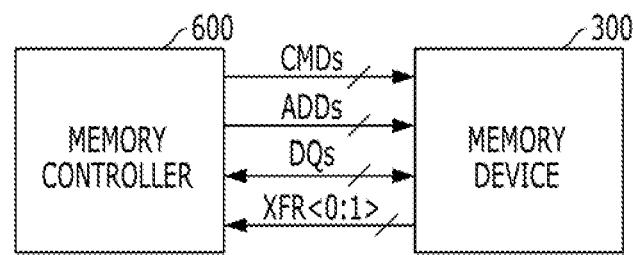
FIG. 6 is a block diagram illustrating a memory system according to another embodiment of the present invention.

FIG. 6 is a block diagram illustrating a memory system according to another embodiment of the present invention.

Referring to FIG. 6, the memory system includes a memory controller 600 and the memory device 300.

The memory controller 600 controls general operations of the memory device 300. The main role of the memory controller 600 causes the memory device 300 to perform write and read operations. The memory controller 600 transmits address signals ADDs and data DQs to the memory device 300 together with a write command CMDs (which is transmitted by combination of signals) in the write operation and stores data in a position designated in the memory cell array 110 of the memory device 300. The memory controller 600 transmits the address signals ADDs to the memory device 300 together with a read command CMDs (which is transmitted by combination of signals) in the read operation and calls for the data stored at the position designated in the memory cell array 110 of the memory device 300.

The memory controller 600 controls the memory device 300 so that a defective cell in the memory cell array 110 of the memory device 300 may be repaired, and the fail address is programmed in the storage unit 330. The relevant details of an operation for repairing memory device 300 will be described with reference to FIG. 7.

Figure 7:
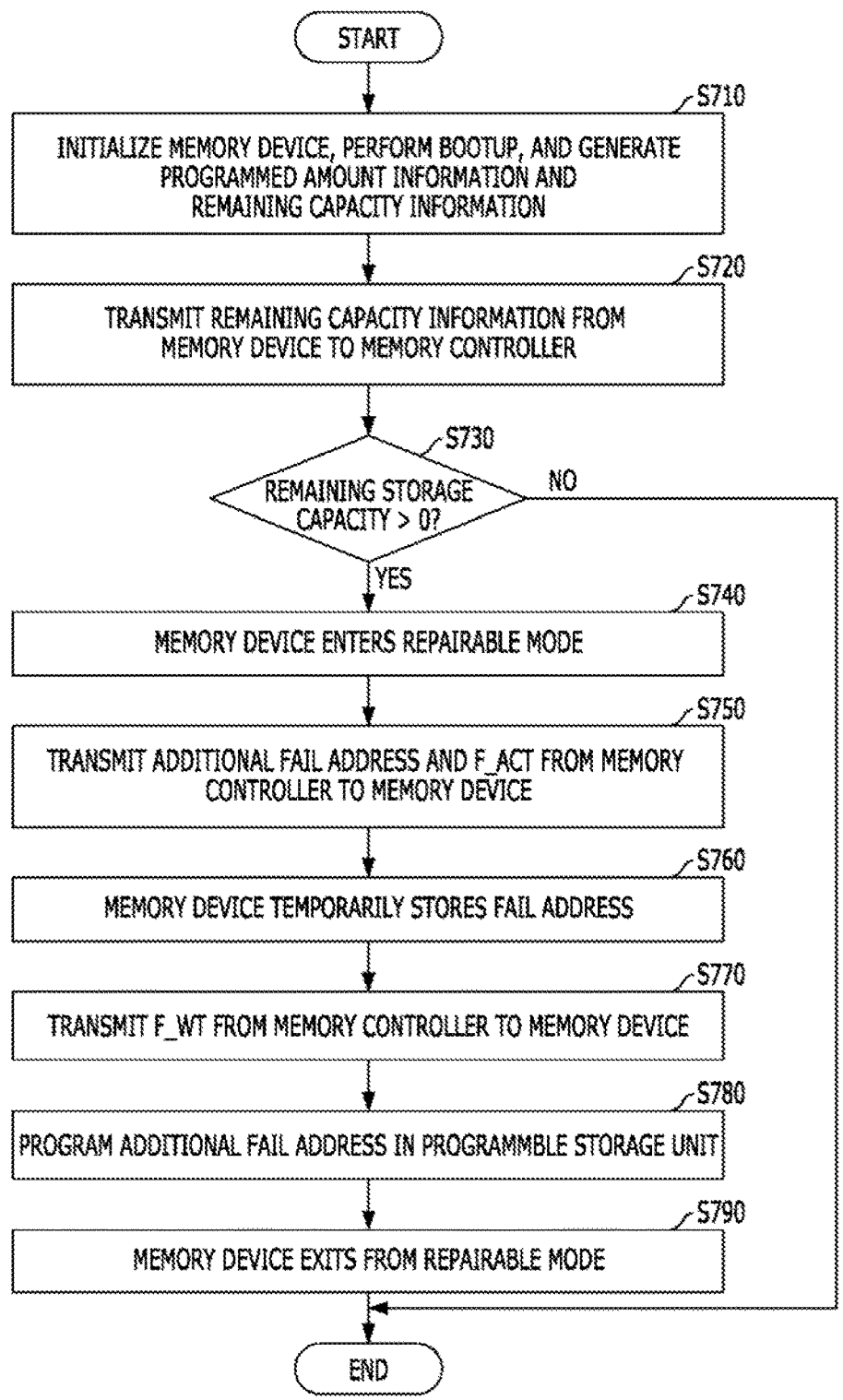
FIG. 7 is a flow chart illustrating an operation of the memory system shown in FIG. 6.

FIG. 7 is a flow chart illustrating an example of an operation relevant to the repairing of the memory device 300 during an operation of the memory system shown in FIG. 6.

Referring to FIG. 7, first, the memory device 300 is initialized, the boot-up is performed, and the occupied amount information XF<0:4> and the available capacity information XFR<0:1> are generated (S710). Power is supplied to the memory device 300 and various initialization operations are simultaneously performed in the memory device 300. The initialization operation of the memory device 300 and the boot-up operation for transmitting the boot-up data BOOTUP_DATA, for example, the fail address, from the storage unit 330 in the memory device 300 to the register unit 220 are simultaneously performed. The boot-up operation is performed by sequentially performing an operation of reading the storage sets in the storage unit 330. The available storage capacity determination unit 340 generates the occupied amount information XF<0:4> in accordance with a method of counting the number of storage sets in which the validity information EN has the value of '1' among the storage sets. Then, the available storage capacity determination unit 340 generates the available capacity information XFR<0:1> using the occupied amount information XF<0:4>.

The available capacity information XFR<0:1> generated in the memory device 300 is transmitted from the memory device 300 to the memory controller 600 (S720). It is determined whether subsequent repair-relevant operations are performed using the available capacity information XFR<0:1> transmitted to the memory controller 600 (S730). When there is no available capacity in the storage unit 300 and XFR<0:1>=(0, 0), the repair operation may no longer be performed. Therefore, the subsequent repair-relevant operations (S730 to S780) are not performed. Conversely, when there is an available capacity and XFR<0:1>≠(0, 0), the repair-relevant operations (S740 to S790) are performed.

To repair the memory device 300, the memory controller 600 controls the memory device 300 to enter into a repairable mode (also referred to as a post package repair mode) (S740). Combination of the address signals ADDs and the command signals CMDs applied to the memory device 300 by the memory controller 600 may lead to the repairable mode.

The memory controller 600 transmits the fail address indicating the position of a defective cell in the memory cell array 110 of the memory device 300 to the memory device 300 using the address signals ADDs. Then, a command notifying that the fail address is transmitted using the address signals ADDs is applied to the memory device 300 (S750). The memory controller 600 may apply the command to the memory device 300 by combining the same command signals CMDs as those indicating the active command the memory device 300 when the memory device 300 enters the repairable mode.

The command decoder 310 of the memory device 300 activates the repair active command F_ACT based on the control (S750) of the memory controller 600. The control unit 320 latches the address signals ADDs transmitted from the memory controller 600 based on the repair active command F_ACT (S760). Here, the temporarily stored address signals directly become the fail addresses to be stored in the storage unit 330.

The memory controller 600 transmits a command to program the additional fail address to the memory device 300 (S770). The memory controller 600 may apply the command to the memory device 300 by combining the same command signals CMDs as those indicating the write command when the memory device 300 enters the repairable mode.

The command decoder 310 of the memory device 300 activates the repair write command F_WT based on the control (S770) of the memory controller 600. The control unit 320 confirms whether the logic value of the 0th data pad DQ0 is '0' after a time of a write latency WL has elapsed from the time of the activation of the repair write command F_WT. When the logic value of the 0th data pad DQ0 is '0,' the control unit 320 programs the temporarily stored fail address in the storage unit 330. When the logic value of the 0th data pad DQ0 is '1,' the control unit 320 does not program the additional fail address in the storage unit 330 (S780). Here, the reason why the control unit 320 confirms the logic value of the 0th data pad DQ0 is to identify a memory device to be controlled by the memory controller 600 among a plurality of memory devices when the memory controller 600 controls multiple memory devices. When the additional fail address temporarily stored in step S780 is programmed in the storage unit 330, the storage set in which the additional fail address is to be programmed among the storage sets in the storage unit 330 is determined using the occupied amount information XF<0:4> transmitted to the control unit 320.

Since the repair operation of programming the additional fail address in the storage unit 330 is completed, the memory controller 600 controls the memory device 300 so that the memory device 300 exits from the repairable mode (S790). The memory device 300 may exit from the repairable mode by appropriately combining the address signals ADDs and the command signals CMDs applied to the memory device 300 by the memory controller 600. When the memory device 300 is initialized again, the additional fail address newly programmed in the storage unit 330 is transmitted from the storage unit 330 to the register unit 220 through the boot-up operation, and thus, a defective cell is repaired (or substituted).

According to the embodiments of the present invention, the number of storage sets that are available and remain in the storage unit 330 is transmitted from the memory device 300 to the memory controller 600. Accordingly, the memory controller 600 may easily comprehend how much the repairing may be additionally performed in the memory device 300. Further, the repairing in the memory device 300 may be performed at any time by combining the address signals ADDs and the command signals CMDs applied to the memory device 300. Therefore, it may be possible to obtain the advantage that users of the memory device may repair defects found after the memory device 300 is manufactured.

In the above-described embodiments, the example has been described in which only 31 storage sets are present in the storage unit 330 in the memory device 300. The number of storage sets in the storage unit 330 may, of course, be hundreds to tens of thousands. The embodiments have been described in which it is assumed that a fail row address is stored in the storage unit 300 and the row repairing is performed to repair a row using the fail row address. However, an embodiment may be also realized in which a column is repaired using a fail column address. The example has been described in which the active command is used to latch the fail address after the entrance into the repairable mode and the write command is used to program the latched fail address. However, the commands used to perform these operations may be other commands.

In the above-described embodiments, it has been indicated that the number of available storage sets is 0, 1, 2, or 3 or more. However, even when the number of available storage sets is over 3, exact number of the available storage sets may be indicated according to a circuit design.

According to the embodiments of the present invention, it may be possible to easily comprehend a remaining capacity available in the storage unit and store the repair information. Therefore, it may be possible to know how much repairing may be further performed. Further, it may be possible to obtain an advantage of easily designating a place in which additional repair information may be stored in the storage unit.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a memory cell array having a plurality of memory cells;
   a storage unit suitable for storing a fail address corresponding to a fail memory cell in the memory cell array;
   an available storage capacity determination unit suitable for generating available capacity information indicating an available storage capacity in the storage unit;
   an output circuit suitable for outputting the available capacity information; and
   a command decoder suitable for generating an active command, a precharge command, a read command and a write command by decoding command signals inputted to the memory device in a normal mode, and generating a repair active command for indicating that an additional fail address is inputted to the memory device and a repair write command for writing the additional fail address to the storage unit in a repairable mode,
   wherein the additional fail address is stored temporarily in the memory device in response to the repair active command, and the temporarily stored additional fail address is programmed to the storage unit in response to the repair writing command.

2. The memory device of claim 1, wherein a boot-up operation for transmitting all of the respective fail addresses stored in the storage unit to a register unit is performed in an initial operation of the memory device.

3. The memory device of claim 1, wherein the storage unit includes any one of an e-fuse array, a NAND flash memory, a NOR flash memory, a magnetic random access memory, a spin transfer magnetic random access memory, a resistive random access memory, and a phase change random access memory.

4. The memory device of claim 1, wherein the storage unit includes a plurality of storage sets, each storing respective validity information and a respective fail address, and
   wherein the available storage capacity determination unit includes:
   a counter suitable for counting the number of activated validity information and generating occupied amount information; and
   an available capacity information generator suitable for generating the available capacity information by subtracting the occupied amount information from the total number of the storage sets in the storage unit.

5. The memory device of claim 4, wherein the counter counts the number of activated validity information when the boot-up operation is performed.

6. A memory device comprising:
a memory cell array having a plurality of memory cells;
a storage unit suitable for storing a fail address corresponding to a fail memory cell within the memory cell array;
an available storage capacity determination unit suitable for generating occupied amount information indicating a storage capacity occupied in the storage unit; and
a control unit suitable for controlling the storage unit to be stored with an additional fail address inputted from the outside at an available position of the storage unit determined using the occupied amount information; and
a command decoder suitable for generating an active command, a precharge command, a read command and a write command by decoding command signals inputted to the memory device in a normal mode, and generating a repair active command for indicating that an additional fail address is inputted to the memory device and a repair write command for writing the additional fail address to the storage unit in a repairable mode,
wherein the additional fail address is stored temporarily in the control unit in response to the repair active command, and the temporarily stored additional address is programmed to the storage unit in response to the repair writing command.

7. The memory device of claim 6, further comprising an output circuit suitable for outputting the available capacity information.

8. The memory device of claim 6, wherein a boot-up operation for transmitting all of the respective fail addresses stored in the storage unit to a register unit is performed in an initial operation of the memory device.

9. The memory device of claim 8, wherein the available storage capacity determination unit includes:
a counter suitable for counting the number of activated validity information and generating occupied amount information; and
an available capacity information generator suitable for generating the available capacity information by subtracting the occupied amount information from the total number of the storage sets in the storage unit.

10. The memory device of claim 6, wherein the storage unit includes any one of an e-fuse array, a NAND flash memory, a NOR flash memory, a magnetic random access memory, a spin transfer magnetic random access memory, a resistive random access memory, and a phase change random access memory.

11. The memory device of claim 6, wherein the available storage capacity determination unit generates available capacity information indicating a storage capacity available in the storage unit.

12. The memory device of claim 6, wherein the storage unit includes a plurality of storage sets, each storing respective validity information and a respective fail address.

13. An operation method of a memory system including a memory device and a memory controller, the method comprising:
initializing the memory device and generating an available capacity information indicating remaining storage capacity of a storage unit of the memory device;
transmitting the available capacity information from the memory device to the memory controller;
determining whether to perform a repair operation based on the available capacity information;
controlling the memory device to enter into a repairable mode by the memory controller, when it's determined to perform the repair operation;
transmitting an additional fail address and a repair active command from the memory controller to the memory device;
temporarily storing the additional fail address in response to the repair active command;
transmitting a repair write command from the memory controller to the memory device;
programming the temporarily stored additional address to the storage unit in response to the repair write command; and
controlling the memory device to exit the repairable mode by the memory controller.

* * * * *